INVENTOR
SETSUWO YAMAMOTO
BY Paul M. Craig, Jr.
ATTORNEY

INVENTOR
SETSUWO YAMAMOTO
BY Paul M. Craig, Jr.
ATTORNEY

United States Patent Office 3,439,276

Patented Apr. 15, 1969

3,439,276

AMPLIFIER PROVIDING COMBINED LIMITER AND SQUELCH FUNCTIONS

Setsuwo Yamamoto, Yokohama, Japan, assignor to Hitachi, Ltd., Tokyo, Japan, a corporation of Japan Filed Feb. 18, 1964, Ser. No. 345,626
Claims priority, application Japan, Feb. 22, 1963, 38/7,693
Int. Cl. H04b *1/06, 1/10, 1/16*
U.S. Cl. 325—348 6 Claims

ABSTRACT OF THE DISCLOSURE

A combined limiter and squelch amplifier system in which the output electrode of an amplifier is connected to a power supply through a resistor and a bias voltage is supplied to the input electrode thereof with a polarity in such a manner that the current of the output electrode of the amplifier is increased. As a result, when the amplitude of the input signal is below a predetermined value, the output electrode current is increased by the bias voltage supplied to the input electrode and the voltage drop across the resistor is increased so as to lower the output electrode voltage thereby to make the amplification degree (gain) of the amplifier low, and the weak input signal is not passed through the amplifier. When the amplitude of the input signal is above the predetermined value, the bias voltage is cancelled by the input signal voltage, the output electrode current is decreased to increase the output electrode voltage, the input signal is amplified by the amplifier, so an amplified output signal is derived. A direct current output signal which is obtained by rectifying said amplified output signal is supplied to the input electrode so as to cancel the bias voltages, whereby the output electrode current of the amplifier is further decreased and the output amplitude of the amplifier is made constant.

This invention relates to amplifiers for amplifying radio frequency electrical signals, and more particularly to those adapted for use in receivers of frequency-modulated radio waves.

When the amplitude of radio signals received in a frequency-modulated wave receiver is changed by noise and the like, the output of the detector for detecting the signals is proportional to the input voltage applied to the detector, and the output naturally contains noise mixed therein, resulting in lowering of the signal-to-noise ratio. In addition, if the input voltage of a receiver for frequency-modulated waves is not higher than the noise voltage to a certain extent, the signal-to-noise ratio drops relative to the amplitude-modulated waves, resulting in an abrupt increase of noise.

In order to prevent the above-mentioned defects, limiter circuits are used in conventional F.M. receivers. Such a limiter circuit serves to make constant the amplitude of signal voltage supplied to the detector, to restrain noise contained in the received signal and to minimize noise voltage contained in the output of the detector. Further, when the input signal to a receiver is relatively small, a squelch circuit is provided for lowering the amplification ratio of an input amplifier to prevent noise from being supplied to low frequency amplifiers used in the output stages of the receiver.

An object of the present invention is to provide an amplifier of such a nature that a single amplifier is able to effect both limiter and squelch operations.

Another object of the present invention is to provide an amplifier such that, after the amplifier has received signals of a certain value to have its amplification ratio increased to a level to institute limiter operation, with such limiter operation being sustained even if the input signal voltage should be lowered instantaneously to a value lower than that when the limiter operation commenced.

A more general object of the present invention is to provide an amplifier which does not provide output signals when the input signal has an amplitude lower than a predetermined value, but operates to amplify the input signal when the amplitude is higher than the predetermined value, thus producing output signals of substantially constant amplitude.

According to the present invention, the amplification ratio of the amplifier is zero to produce no output signal when the input signal is of minute amplitude, but when the input signal is of sufficiently large amplitude, the amplification ratio of the amplifier is rendered high enough to produce amplified output signals of constant amplitude, regardless of amplitude variations of an input signal.

The amplifier embodying the present invention operates in either one of two stable conditions, one when there is no output signal because the input signal value is too low and one when there is produced output signals of constant amplitude in response to input signals above a certain value. For this reason, the amplifier is called a "bistable amplifier."

There are other objects and particularities of the present invention, which will be made obvious from the following detailed description of the invention, with reference to the accompanying drawings, in which.

In circuits where the present invention is applied to the intermediate-frequency ampliying stage of a frequency-modulated wave receiver, the amplification ratio of the bistable amplifier connected between an intermediate-frequency amplifier and a detector is zero when the input signal voltage is below a certain value, and no signal is supplied to the detector. On the other hand, when the input signal voltage is above a certain value, the amplification ratio of the bistable amplifier is increased to supply output signals to the detector, and the output signal voltage of the bistable amplifier is made constant, any noise contained in the signal being suppressed. In addition, after the bistable amplifier begins to produce constant-amplitude output signals as above-described, its amplification ratio is not decreased, even when the input signal voltage instantaneously drops below the value of that when the amplification ratio begins to increase. Thus, the constant-amplitude output signal voltage is sustained, and the amplification ratio of the bistable amplifier is prevented from being unstabilized by virtue of fading or the like.

Figure 1:
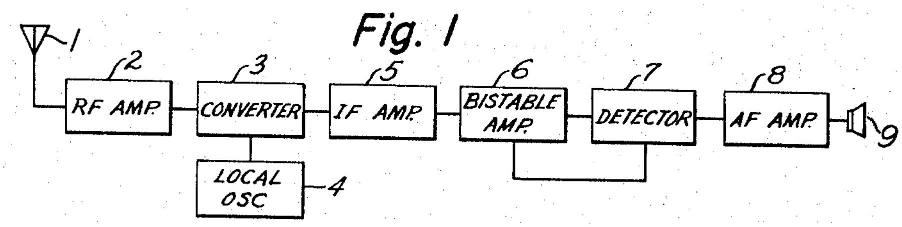
FIG. 1 is a block diagram of a frequency-modulated wave receiver employing a bistable amplifier embodying the present invention.

Referring now to FIG. 1 of the accompanying drawings, showing the superheterodyne system of a frequency-modulated wave receiver, the radio-frequency input signal from an antenna 1 is amplified by a radio-frequency amplifier 2, and supplied to a frequency convertor 3. The radio-frequency signal supplied to the frequency convertor 3 is converted to intermediate-frequency signal with the signal from a local oscillator 4, and then supplied to an intermediate-frequency amplifier 5. The amplified output of the latter is supplied to a bistable amplifier 6 of the present invention. The constant-amplitude signal from the bistable amplifier is applied to a detector 7, and the intermediate-frequency signal detected thereby is separated into an audio-frequency component and a D.C. component. The audio-frequency component is applied to an audio-frequency amplifier 8, while the direct-current component is fed back to the bistable amplifier 6. The amplified audio-frequency component drives a speaker 9. The D.C. component fed back to the bistable amplifier 6 serves to provide the limiter operation when the intermediate-frequency signal voltage supplied to the bistable amplifier is higher than a certain value, while when the intermediate-frequency signal is of minute value, the D.C. component serves to provide the squelch operation, by proper control of the amplification ratio of amplifier 6.

Figure 2:
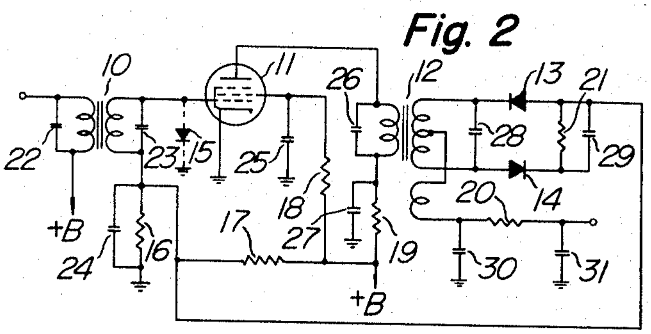
FIG. 2 is a circuit diagram of bistable amplifier embodying the present invention.

Referring to FIG. 2, 10 designates the last-stage transformer of the intermediate-frequency amplifier 5 shown in FIG. 1; 11 a vacuum tube for bistable amplification; 12 a frequency discriminating transformer; 13 and 14 detector diodes; 15 a bias diode; 16, 17, 18, 19, 20 and 21 resistors, and 22, 23, 24, 25, 26, 27, 28, 29, 30 and 31 condensors.

One end of the primary winding of intermediate-frequency transformer 10 is connected to the plate, not shown, of intermediate-frequency amplifier tube of the preceding stage, and the other end thereof is connected to an electrical source +B. The primary winding is connected also in parallel with a tuning condenser 22 for tuning the transformer to the intermediate-frequency signal. One end of the secondary winding of transformer 10 is connected to the first grid of bistable amplifier tube 11, and the other end is connected to the ground through parallel-connected resistor 16 and condensor 24. In addition, the resistor 16 and the above-mentioned other end of the transformer secondary are connected to the electrical source +B through resistor 17. The above-identified secondary winding is connected in parallel with tuning condenser 23 for intermediate-frequency tuning.

The cathode of bistable amplifier tube 11 is directly connected to the ground, the plate of the same is connected to one end of the primary winding of discriminator transformer 12, and the other end of the same is connected to the electrical source +B, through resistor 19, and also to the ground through condenser 27. The primary winding of transformer 12 is shunted by tuning condenser 26 for intermediate-frequency tuning. The second grid of tube 11 is connected to the electrical source resistor 18, and also to the ground through condenser 25.

One end of the secondary winding of transformer 12 is connected to the cathode of detector diode 13, while the other end is connected to the anode of detector diode 14. The transformer secondary is connected in parallel with tuning condenser 28 for intermediate-frequency tuning. The anode of diode 13 is connected to the cathode of diode 14 through parallel-connected resistor 21 and condenser 29, and also to the afore-mentioned other end of the secondary winding of intermediate-frequency transformer 10. One end of a tertiary winding of transformer 12 is connected to the midpoint of the secondary winding, while the other end is connected to a low-frequency amplifier, not shown, of the next stage through resistor 20. The opposite ends of resistor 20 are connected to the ground through condensers 30 and 31, respectively.

The bias diode 15 is used when required as hereinafter described, and when used, its anode is connected to the first grid of bistable amplifier tube 11, while the cathode is connected to the ground. Other high-frequency amplifying stages and low-frequency amplifying stages employed in the system of FIG. 1 are conventional, and are not illustrated in detail.

In operation, the first grid of bistable amplifier tube 11 has a positive potential applied thereto from the source +B through the bleeder circuit of resistors 16 and 17. The second grid of tube 11 is energized by relatively a high positive potential from the source +B through resistor 18. The positive potential applied to the first grid biases the same positive with respect to the cathode, and grid current flows between the first grid and cathode, thus decreasing the impedance therebetween, so that the first grid is substantially earthed. If desired, the diode 15 may be connected between the first grid and the ground, in order to further lower the impedance between the first grid and the ground. In this case, the anode of diode 15 is positive relative to the cathode thereof by virtue of the bias voltage, its impedance is extremely small, and the first grid is more positively earthed. As the first grid is biased positive, the plate current of tube 11 is increased, and the potential drop between the opposite ends of resistor 19 increases to lower the plate potential of tube 11. Consequently, the amplification ratio of bistable amplifier tube 11 is lowered abruptly, resulting in no amplifying operation. Under such a condition, when an input signal voltage is supplied to the first grid of tube 11 through intermediate-frequency transformer 10, and if the signal voltage is relatively low, the positive potential on the first grid may be somewhat lowered during the negative half cycle of the received signal, but the signal is fed back through the cathode of tube 11 or diode 15. Consequently, the bistable amplifier tube 11 does not effect amplification, and does not supply signal to the detector.

On the other hand, when the received signal voltage applied to the first grid of tube 11 is high enough, the positive bias potential on the first grid is cancelled out by the negative half wave of the received signal and the first grid is biased negative instantly. Consequently, the plate current of tube 11 is decreased during the negative half cycle of the received signal, lowering the potential drop in the resistor 19 to raise the plate potential of tube 11, which then commences amplifying operation. This amplifies the negative half cycle of the received signal, which is supplied to the discriminating transformer 12. The secondary current of transformer 12 is rectified by the detector diodes 13 and 14, and produces voltage across the resistor 21, such that the cathode side of diode 14 is positive and the anode side of diode 13 is negative. This negative potential is fed back to the aforementioned other end of intermediate-frequency transformer 10, to cancel the positive bias potential applied to the first grid of tube 11. As a result, the positive potential on the first grid of tube 11 is sufficiently lowered to raise its plate potential, and the amplification ratio of tube 11 is increased. Consequently, the negative half cycle of the input signal from transformer 10 applied to the first grid of tube 11 is amplified further, and the negative potential obtained through detector diodes 13 and 14 is increased further. As a result, the first grid of tube 11 becomes biased negative. By this reason, the first grid current ceases to flow, resulting in increase of the impedance between the first grid and the cathode of tube 11. The impedance of diode 15 is also increased, because the diode becomes biased in the reverse direction. The plate current of tube 11 is decreased by virtue of the fact that the first grid is biased negative, and the plate potential becomes relatively a high positive potential. Under such a condition, the input signal applied to the first grid of tube 11 is wholly amplified and supplied to the primary winding of discriminating transformer 12, whose secondary current is rectified by detector diodes 13 and 14, and separated into an audio frequency component and a D.C. component. The audio frequency component is supplied to the audio frequency amplifier of the next stage, not shown, while the D.C. component is fed back to the aforementioned other end of the secondary winding of intermediate-frequency transformer 10, for depressing the positive bias potential on the first grid of tube 11, and for making the output signal voltage of bistable amplifier tube 11 constant by limiter operation.

Figure 3:
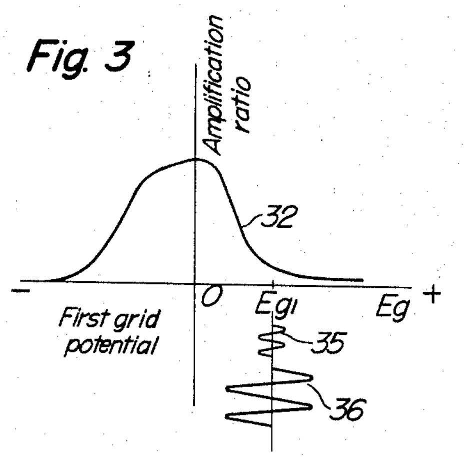
FIGS. 3 and 4 are characteristic curve diagrams for explaining operation of the present invention.

Referring to FIG. 3, in which the abscissa scales the first grid potential $Eg$ of bistable amplifier tube 11, and the ordinate the amplification ratio of the same, the curve 32 shows the relation between the first grid potential and the amplification ratio. As is clearly shown in FIG. 3, the positive bias potential applied to the first grid of tube 11 is set at $Eg_1$ where amplification is not substantially affected, so that minute input signal voltage 35 cannot increase the amplification ratio of tube 11 to produce an output signal. Consequently, any noise commixed with the input signal of similar magnitude or so is not supplied to the audio frequency amplifiers, because of the squelch operation of bistable amplifier tube 11. When the input signal voltage applied to the first grid of tube 11 is higher to a certain extent as shown by curve 36, the negative half cycle of the input voltage shifts the bias potential sufficiently to the left to obtain a large amplification ratio, and the negative half cycle is well amplified to produce an output signal. This output signal is rectified by diodes 13 and 14 and fed back to the first grid of tube 11 in negative sense, as hereinbefore described. This shifts the operating point of tube 11 further to the left in FIG. 3 by rendering the first grid potential negative further relative to the cathode. After some repetition of similar operations, the output signal voltage of tube 11 rises abruptly as shown by curve 33 in FIG. 4 and then is stabilized at a constant value regardless of the magnitude of input signal voltage.

Figure 4:
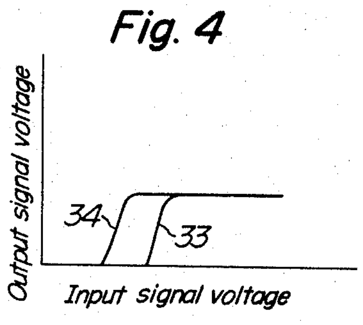

Referring to FIG. 4, in which the abscissa scales the signal voltage applied to the first grid of tube 11, and the ordinate the output signal voltage of the tube, the curve 34 shows the characteristics of tube 11 when the input signal voltage is sufficiently high from the first time, while the curve 33 shows the characteristics when the input signal voltage becomes high enough afterwards as described hereinbefore.

During the stable amplifying operation of tube 11, when a low input signal voltage is applied to the first grid of tube 11, the voltage across resistor 21 produced by the rectifying operation of detector diodes 13 and 14 might be lowered to decrease the negative potential fed back to the first grid of tube 11, thereby shifting the first grid potential to positive. However the negative voltage obtained by the rectifying operation of detector diodes 13 and 14 is stored in condenser 29, and this voltage assures that the output signal voltage of tube 11 be of constant amplitude. Thus, once the bistable amplifier tube 11 has attained a certain constant amplification ratio to commence the limiter operation, the limiter operation is maintained, even when the input signal voltage drops to a certain degree, to suppress noise.

Figure 5:
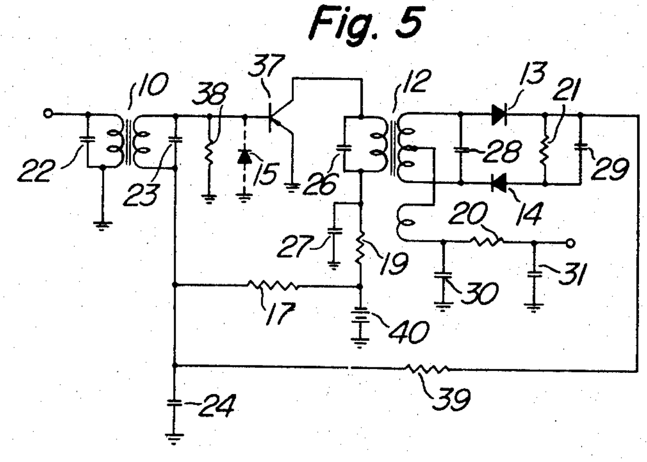
FIG. 5 is a circuit diagram of bistable amplifier showing another embodiment of the present invention.

In the embodiment shown in FIG. 5, the bistable amplification is effected by use of a transistor. In this figure, 37 designates the bistable amplifier transistor; 38 and 38 resistors; and 40 electrical source. Same reference numerals as in FIG. 2 show corresponding elements, respectively.

The base electrode of transistor 37 is connected to one end of the secondary winding of intermediate-frequency transformer 10, and also to the ground through a resistor 38, while the emitter electrode is connected direct to the ground. The collector electrode of transistor 37 is connected to one end of the primary winding of discriminating transformer 12, the other end thereof is connected to the negative terminal of battery 40 through resistor 19, and the positive terminal of the battery is connected direct to the ground. The diode 15 has its cathode connected to the base of transistor 37 and its anode connected to the ground, and may be used when desired as explained hereinafter. Otherwise, the construction is similar to that shown in FIG. 2.

In operation, a large negative potential is applied to the base of transistor 37 through resistor 17 from battery 40, and a bias voltage is applied in the forward direction between the base and emitter of transistor 37. Consequently, a large base current flows to lower the impedance between the base and emitter, and the base is in the condition that it is connected direct to the ground. In order to further decrease the impedance between the base and emitter, diode 15 may be connected between th base and ground. In this case, the diode 15 is biased in the forward direction so that its cathode is negative relative to its anode, and its impedance is extremely small. Thus, the base of transistor 37 is connected to the ground substantially directly. As the impedance between the base and emitter of transistor 37 is extremely small, its collector current increases to the saturation condition to lower the amplification ratio. Under such a condition, if the input signal voltage is applied to the base of transistor 37 through intermediate-frequency transformer 10, and when the received signal voltage is relatively low, the negative potential applied to the base of transistor 37 may somewhat be decreased by the positive half cycle wave of received signal, but the received signal is fed back through the emitter or diode 15. Consequently, the transistor 37 does not effect amplification operation, and does not supply an output signal to the next-stage detector.

When the input signal voltage applied to the base of transistor 37 from intermediate-frequency transformer 10 is high enough, its positive half cycle cancels the negative bias potential applied on the base of transistor 37, lowering the base current from the emitter to the base, thereby decreasing the collector current to cause the transistor to effect the amplifying operation. Consequently, the positive half cycle of an incoming signal from transformer 10 is amplified and supplied to the primary winding of discriminating transformer 12 connected in the collector circuit of transistor 37. The secondary output of transformer 12 is rectified by detector diodes 13 and 14, and a voltage is produced across resistor 21 such that the cathode side of diode 13 is positive and the anode side of diode 14 is negative. The positive potential thus produced is fed back to the lower end of transformer 10 through resistor 39, and acts to cancel the negative potential applied to the base of transistor 37 from battery 40 through resistor 17. As a result, the base current of transistor 37 is further decreased to increase the amplification ratio of transistor 37 and the positive feed back potential through resistor 39, to further increase the amplification ratio of transistor 37. By repetition of such operations, the amplification ratio of bistable amplifier transistor 37 reaches a certain stable point, and its output signal voltage becomes and is maintained constant.

Figure 6:
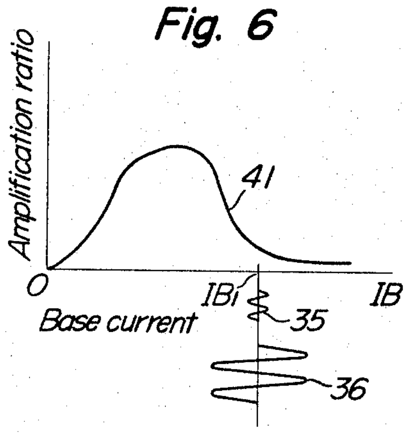
FIG. 6 is a characteristic curve diagram for explaining the operation of the embodiment shown in FIG. 5.

Referring to FIG. 6, the cure 41 is plotted with base current IB of transistor 37 as abscissa and amplification ratio of the same as ordinate. As is clearly understood from FIG. 6, the base current IB of bistable amplifier transistor 37 is set at $IB_1$, where the collector current is saturated and the amplification ratio is substantially zero. Consequently, with minute signal voltage 35 applied to the base electrode, the amplification ratio does not change, and there is no output signal from the transistor. Therefore, any noise mixed with the input signal or similar amplitude or so is not supplied to the audio-frequency amplifier, because of the squelch operation of the transistor. When, however, the input signal voltage applied to the base of transistor 37 is high to a certain extent as represented by curve 36, the positive half cycle of signal 36 shifts the operating point of transistor 37 to the left so that the positive half cycle is amplified and applied to transformer 12. The secondary output of transformer 12 is rectified by detector diodes 13 and 14, and fed back to the base of transistor 37 to further cancel the negative potential on the base supplied from battery 40, thus shifting the base current further to the left to increase the amplification ratio with corresponding increase in the fed-back voltage. By repetition of such operations, the output signal voltage of bistable amplifier transistor 37 is raised abruptly as shown by curve 33 in FIG. 4, and stabilized at a certain amplitude which is constant regardless of input signal. After then, even when the input signal voltage applied to the base of transistor 37 would be lowered, the output signal voltage is sustained constant, suppressing any noise.

In FIG. 5, transistor 37 is shown as a PNP type, but by appropriate polarity reversal a NPN transistor may also be employed as well. Further in FIG. 2, a neon lamp and resistor may be connected in series between the plate electrode of vacuum tube 11 and the ground, in order to obtain visible indication of the increase of amplification ratio to a predetermined value at which the tube commences the limiter operation.

As will be well understood from the above descriptions, according to the present invention, a single amplifier can effect the limiter operation as well as the squelch operation, so that the circuitry of frequency-modulated wave receivers can be simplified. In addition, after the limiter operation has once started, the same is sustained even when the input signal voltage drops, so that the signal-to-noise ratio can be maintained sufficiently high.

What is claimed is:

1. A combined limiter and squelch amplifier system comprising: an amplifier device having an input electrode and an output electrode for supplying output signals, means for supplying input signals from a signal source to said input electrode bias circuit means coupled between the input electrode and a power supply for supplying a bias voltage to said input electrode for normally increasing the current of said output electrode in the absence of an input signal applied to the input electrode above a certain value, a load impedance connected between the output electrode and the power supply for reducing the voltage of the output electrode to a predetermined low value such that the amplifier device exhibits low gain to weak input signals below the certain value, a rectifier for rectifying the output signal of said amplifier device, means for supplying the output from said output electrode to said rectifier, and means for supplying the direct current output signal of said rectifier back to said input electrode with a polarity to cancel the bias voltage from said bias circuit means and increase the gain of the amplifier device in the presence of incoming signals having a signal strength above the certain value whereby there is produced no output signal when the amplitude of the received signal is below the certain value and there is produced an output signal of a constant amplitude when the received signal is above the certain value.

2. A combined limiter and squelch amplifier system according to claim 1 wherein the rectifier comprises the discriminator of a frequency modulation receiver and the system further includes circuit means for deriving both the audio and direct current components of the signal supplied from the output electrode of the amplifier device.

3. A combined limiter and squelch amplifier system comprising: a vacuum tube having a cathode electrode, a control grid electrode and an anode electrode, a signal source connected to said control grid electrode, two resistors disposed between said control grid electrode and a power supply and between said control grid electrode and ground respectively for supplying positive bias voltage to said control grid electrode, a resistor connected between said anode electrode and the power supply for lowering said anode voltage, a diode for rectifying the output signal of said vacuum tube supplied thereto to provide a negative direct current voltage, and means for supplying the output voltage of the diode to said control grid electrode to cancel said bias voltage, whereby there is produced no output signal when the amplitude of the received signal is below a predetermined value and there is produced an output signal of a constant amplitude when the received signal is above the said value.

4. A combined limiter and squelch amplifier system comprising: a transistor having an emitter electrode, a base electrode and a collector electrode, a signal source connected to said base electrode, bias circuit means including a first resistor disposed between said base electrode and a power supply for supplying a bias voltage to increase the current at said collector electrode, a resistor connected between said collector electrode and said power supply for lowering the collector voltage, a diode for rectifying the output signal of said transistor supplied thereto to provide a direct current voltage, and means for supplying the output voltage of the diode back to said base electrode with a polarity to cancel said bias voltage, whereby there is produced no output when the amplitude of the received signal is below a predetermined value and there is produced an output signal of a constant amplitude when the amplitude of the received signal is above the said value.

5. A combined limiter and squelch amplifier system comprising: a vacuum tube having a cathode electrode, a control grid electrode and an anode electrode, an intermediate-frequency transformer connected to said control grid electrode for supplying an intermediate-frequency, frequency-modulated signal thereto, two resistors connected between said control grid electrode and a power supply and between said control grid electrode and the ground respectively for providing a positive bias voltage to said control grid electrode, a discriminating transformer having primary and secondary windings with the primary winding being connected to said anode electrode, a resistor connected between the primary winding of said discriminating transformer and the power supply for lowering the anode voltage, two diodes connected with the secondary winding of the discriminating transformer for demodulating said intermediate-frequency signal amplified in said vacuum tube, and means for deriving a negative direct current voltage from said two diodes and supplying it to the grid electrode of said vacuum tube to cancel said bias voltage, whereby there is produced no output when the amplitude of a received signal is below a predetermined value and there is produced an output signal of a constant amplitude when the amplitude of the received signal is above the said value.

6. A combined limiter and squelch amplifier system comprising: a transistor having a base electrode, an emitter electrode and a collector electrode, an intermediate-frequency transformer having primary and secondary windings with the primary winding being connected to said base electrode for supplying a frequency-modulated intermediate-frequency signal thereto, two resistors connected between said base electrode and a power supply and between said base electrode and a ground connection respectively, for supplying a negative bias voltage to said base electrode, a frequency discriminating transformer connected to said collector electrode, a resistor connected between the frequency discriminating transformer and the power supply for lowering the voltage of said collector electrode, two diodes connected with the secondary winding of said frequency discriminating transformer for demodulating an intermediate-frequency signal amplified in said transistor, and means for deriving a positive direct current bias voltage from said two diodes and supplying said positive bias voltage back to the base electrode of said transistor to cancel said bias voltage, whereby there is produced no output when the amplitude of the received signal is below a predetermined value and there is produced an output signal of a constant amplitude when the amplitude of the received signal is above the said value.

References Cited

UNITED STATES PATENTS 2,704,324 3/1955 Broadhead .......... 325—482
3,061,683 10/1962 Freedman et al. .. 325—348 XR (Other references on following page)

UNITED STATES PATENTS

| | | | |
|---|---|---|---|
| 3,087,116 | 4/1963 | Liberman | 325—413 XR |
| 3,314,010 | 4/1967 | Wolters | 325—348 |

OTHER REFERENCES

Basic Theory and Applications of Transistors, Department of the Army Technical Manual, TM 11–690, March 1959, page 157.

WILLIAM C. COOPER, *Primary Examiner.*

R. S. BELL, *Assistant Examiner.*

U.S. Cl. X.R.

325—319, 478, 412; 329—134; 330—29